United States Patent
Mestdagh et al.

(10) Patent No.: US 6,621,430 B2
(45) Date of Patent: Sep. 16, 2003

(54) ANTISATURATION SYSTEM FOR AN ANALOG-TO-DIGITAL CONVERTER

(75) Inventors: Denis J. G. Mestdagh, Saint Martin d'Uriage (FR); Bengt Lennart Olsson, Lulea (SE); John Torvald Lundberg, Rosvik (SE)

(73) Assignees: STMicroelectronics S.A., Gentilly (FR); Telia AB, Farsta (SE)

( * ) Notice: Subject to any disclaimer, the term of this patent is extended or adjusted under 35 U.S.C. 154(b) by 0 days.

(21) Appl. No.: 10/141,525

(22) Filed: May 7, 2002

(65) Prior Publication Data

US 2003/0048211 A1 Mar. 13, 2003

Related U.S. Application Data

(63) Continuation of application No. 10/016,672, filed on Dec. 10, 2001, now abandoned, which is a continuation of application No. 09/910,434, filed on Jul. 20, 2001, which is a continuation of application No. 09/521,060, filed on Mar. 8, 2000, now Pat. No. 6,288,658.

(30) Foreign Application Priority Data

Mar. 8, 1999  (EP) ............................................. 99410016

(51) Int. Cl.$^7$ ................................................ H03N 1/06
(52) U.S. Cl. ....................................... 341/118; 341/120
(58) Field of Search .................................. 341/120, 118

(56) References Cited

U.S. PATENT DOCUMENTS

| 4,399,416 A | 8/1983 | Gillespie ..................... 330/86 |
| 5,272,654 A | 12/1993 | Nix ....................... 364/715.03 |
| 5,365,233 A | 11/1994 | Schaub ....................... 341/139 |
| 6,288,658 B1 * | 9/2001 | Mestdagh et al. .......... 341/118 |

OTHER PUBLICATIONS

European Search Report from European Patent Application 99410016.2, filed Mar. 8, 1999.
Keinath A. et al. "A/D–Wandler MIT Gleitkomma–Arthmetik" Elektronik, vol. 37, No. 20, Sep. 30, 1988, pp. 81–83, 86–88.

* cited by examiner

*Primary Examiner*—Brian Young
*Assistant Examiner*—Joseph Lauture
(74) *Attorney, Agent, or Firm*—Wolf, Greenfield & Sacks, P.C.; James H. Morris

(57) ABSTRACT

A digital signal processing system, including an analog-to-digital converter adapted to provide at least n-bit samples to a processor, and range selection circuitry for stepwise adjusting the range of the analog-to-digital converter to the amplitude of an input signal and for shifting the position of the n-bit samples on the processor bus according to the selected range.

3 Claims, 2 Drawing Sheets

ANTISATURATION SYSTEM FOR AN ANALOG-TO-DIGITAL CONVERTER

CROSS REFERENCE TO RELATED APPLICATIONS

This application is a continuation of prior application Ser. No. 10/016,672, filed Dec. 10, 2001, now abandoned, which in turn is a continuation of application Ser. No. 09/910,434, filed Jul. 20, 2001, which in turn is a continuation of application Ser. No. 09/521,060, filed Mar. 8, 2000, now U.S. Pat. No. 6,288,658, entitled ANTISATURATION SYSTEM FOR AN ANALOG-TO-DIGITAL, which applications are incorporated herein by reference.

BACKGROUND OF THE INVENTION

1. Field of the Invention

The present invention relates to an analog-to-digital converter used in a digital signal processing system, and more specifically to a solution for overcoming saturation of the analog-to-digital converter.

2. Discussion of the Related Art

FIG. 1 schematically shows an exemplary signal processing chain. The shown chain is part of a conventional Discrete Multi-Tone (DMT) demodulator used, for example, in Digital Subscriber Line (DSL) modems.

An analog incoming signal is provided through a hybrid line interface 10 to an analog processing circuit 12. Circuit 12 typically performs an automatic gain control and a low-pass filtering. The analog signal A provided by circuit 12 is converted into digital samples D by an analog-to-digital converter 14. The digital samples D, for example 12-bits wide, are provided to a Digital Signal Processor (DSP) 16 programmed to carry out the required processing. In a DMT demodulator, the DSP will mainly carry out a Fast Fourier Transform (FFT).

FIG. 2 shows an exemplary portion of analog signal A at the input of analog-to-digital converter 14. In a DMT transmission system, the analog signal is the sum of several subcarriers which are modulated in phase and in amplitude, according to random data to be transmitted. As a consequence, the average amplitude of the signal is relatively low. However, from time to time, several subcarriers may be in phase, causing a high amplitude peak, as shown in the middle of the signal. As illustrated on the right of FIG. 2, the amplitude probability density of the signal follows a gaussian curve centered on amplitude zero, i.e. the smaller amplitudes have a higher probability of occurrence than the higher amplitudes.

A problem in designing the analog-to-digital converter 14 is that its range should be adapted to the most probable amplitudes in order to reduce the quantization noise of the conversion to an acceptable value, given the number of bits of the converter.

In practice, the range of the converter, included between values −Vt and +Vt in FIG. 2, is chosen so that the amplitudes of the signal have a given maximum probability of occurring within the range, accepting that, from time to time, there will be amplitudes out of range.

When out-of-range amplitudes occur, the analog-to-digital converter saturates, producing undesirable frequency domain components after the FFT.

In order to avoid the saturation of the converter, it could be devised to extend its range. However, if the range is extended without increasing the number of bits of the converter, the resolution of the converter decreases, causing an increase of the quantization noise.

Thus, the best solution would be to increase the range of the converter and correspondingly increase the number of bits of the converter in order to maintain the resolution. However, increasing the number of bits of the converter increases the complexity of the design of the converter.

Another solution for avoiding saturation of the analog-to-digital converter is to perform a compression of the analog input signal and to perform a corresponding expansion of the digital output signal. This technique is known as "non uniform quantization" and is described in the manual "Digital Communications—Fundamentals and applications", by Bernard Sklar, Prentice-Hall, 1988.

SUMMARY OF THE INVENTION

An object of the present invention is to provide a low complexity signal processing system overcoming the effects of high amplitude peaks on an analog-to-digital converter by using this compression technique and the statistical properties of the signal to increase the effective resolution.

This and other objects are achieved by a digital signal processing system, comprising an analog-to-digital converter adapted to provide at least n-bit samples to a processor, and range selection means for stepwise adjusting the range of the analog-to-digital converter to the amplitude of an input signal and for shifting the position of the n-bit samples on the processor bus according to the selected range.

According to an embodiment of the invention, the analog-to-digital converter provides (n+m)-bit samples aligned with the least significant bits of said bus.

According to an embodiment of the invention, the analog-to-digital converter is constructed to have an n-bit accuracy.

According to an embodiment of the invention, the range selection means comprise m amplifiers of respective gains 20 to 2 m; a multiplexer connected for providing to the analog-to-digital converter the output of one amplifier selected according to the amplitude of the input signal; and a barrel-shifter adapted to select n+m bits in an (n+2 m)-bit word comprised of m constant value most significant bits, the n bits provided by the analog-to-digital converter, and m zero least significant bits, the n+m bits being selected according to the amplifier selected by the multiplexer.

The foregoing and other objects, features, aspects and advantages of the invention will become apparent from the following detailed description of embodiments, given by way of illustration and not of limitation with reference to the accompanying drawings.

DETAILED DESCRIPTION

A purpose of the invention is to dynamically adjust the range of an analog-to-digital converter to the amplitude of the incoming signal without substantially increasing the complexity of the system. In particular, the complexity of the converter is chosen to satisfy conventional quantization noise requirements. When the input signal has amplitudes not exceeding a normal range, the operation of the converter is conventional. When the amplitude of the signal exceeds the range, the range of the converter is increased so that the amplitude stays within the increased range.

Of course, since the number of bits of the converter remains the same, the range increase causes a corresponding resolution reduction and thus a quantization noise increase. However, in an application where the amplitude surges have a low occurrence probability, like in DMT transmission systems, the contribution to the average noise caused by the increased quantization noise for the occasional surges is much less than that of a saturation of the analog-to-digital converter.

Figure 1:
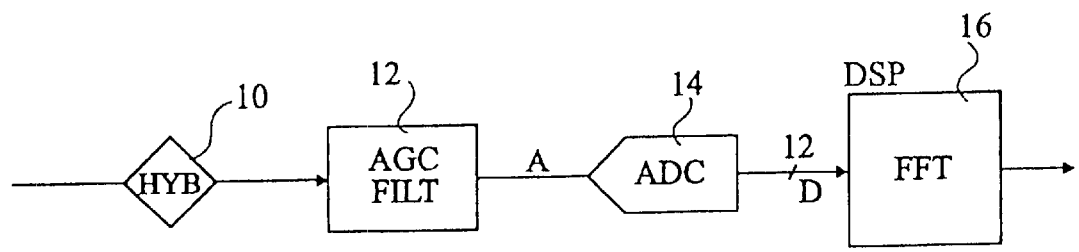
FIG. 1, previously described, partially and schematically shows an input signal processing chain of a DMT demodulator.
Figure 2:
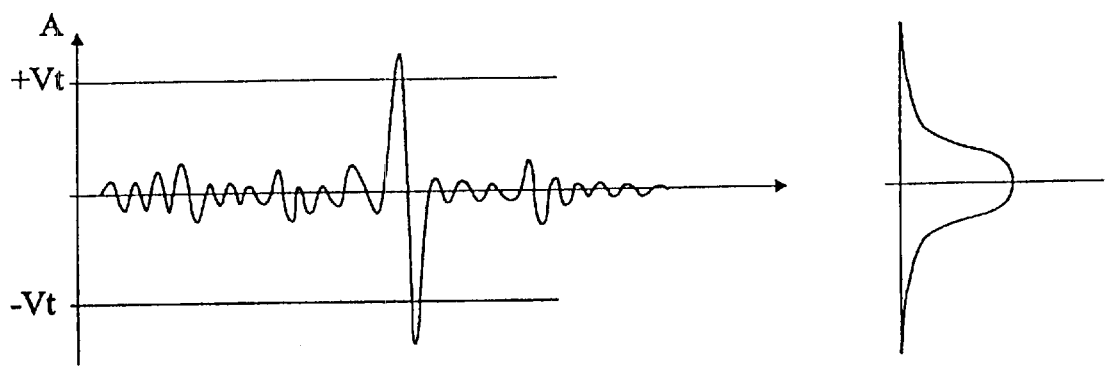
FIG. 2 shows an exemplary analog input signal processed by an analog-to-digital converter in the processing chain of FIG. 1.

If the size of the analog-to-digital converter is n bits for the normal range and resolution (n=12 in FIG. 1), this converter in fact has m additional bits in an embodiment of the invention, which enables the converter to "see" a surge of 2 m times the normal range in the input signal.

Of course, this may be obtained directly by using an (n+m)-bit converter instead of the normally required n-bit converter. However, as previously mentioned, this would substantially increase the complexity of the design of the converter.

To avoid this additional complexity, a first aspect of the invention is to use only n bits for the digital processing, among the n+m bits of the samples provided by the converter. More specifically, for positive samples, if the first non-zero most significant bit (MSB) is within the n least significant bits (LSBs), the n LSBs are provided to the DSP 16. If the first non-zero MSB is at a position m+k, with m≧k>0, the n consecutive bits up to position n+k are provided to the DSP 16 as the n-bit sample to process. The DSP is then programmed to internally multiply this sample by $2^k$.

Thus, only n bits among the n+m bits provided by the converter are effectively exploited. In other words, when the n MSBs are exploited, the m LSBs are ignored and may even be incorrect. As a result, and according to a second aspect of the invention, although the converter produces n+m bits, it is designed for having the accuracy required for producing only n bits. The components of the analog-to-digital converter may be designed to be 2 m times less accurate than the components which would be required for a conventional (n+m)-bit converter. This considerably relaxes the design constraints of the converter and reduces its complexity.

A particularly well suited type of analog-to-digital converter is a pipeline converter. In a pipeline converter, the number of bits produced is a multiple of the number of pipeline stages. According to the invention, the converter would simply be provided with additional stages for producing the m additional bits, these additional stages having the same structure and accuracy as the other stages. The complexity of the converter thus only increases linearly.

Figure 3:
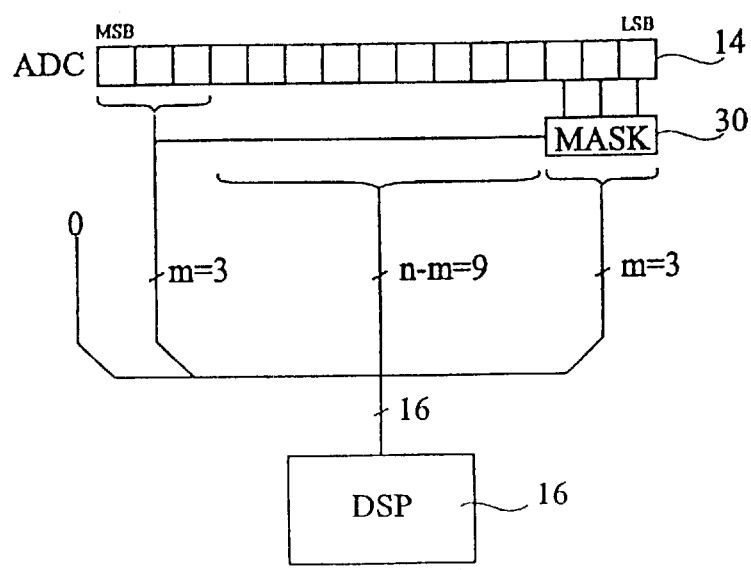
FIG. 3 illustrates the principle of the invention with one embodiment of the invention.

FIG. 3 illustrates an advantageous method for providing the n necessary bits to DSP 16 and multiplying the corresponding values by $2^k$, where k is the offset of the n used bits with respect to the LSBs.

In fact, a conventional DSP 16 operates with a fixed width bus which is generally wider than the n+m bits provided by the analog-to-digital converter 14. As an example, the DSP bus is 16 bits wide, whereas n=12 and m=3. In this case, the n+m bits of the converter are aligned with the LSBs of the DSP bus, the m LSBs being passed onto the DSP bus through a mask 30. Mask 30 is programmed so that it cancels up to m LSBs according to the position of the first significant MSB provided by the converter. For positive samples, a "significant bit" has value 1, whereas for negative samples, it has value 0.

In the example, if the first non-zero MSB is at position 15, mask 30 will contain 3 zeros which will cancel the 3 LSBs.

If the first significant MSB is at position 14, i.e. k=3, mask 30 will contain value 100 which cancels the two LSBs.

If the first significant MSB is at position 13 (k=2), mask 30 will contain value 110, canceling the LSB.

Finally, if the first significant MSB is at position 12 or below (k≦1), mask 30 will contain value 111, whereby all three LSBs are passed onto the DSP bus.

With this configuration, when the position of the first significant MSB exceeds the $12^{th}$, the effectively used n bits are left-shifted by a value k on the DSP bus, which directly corresponds to the required multiplication by factor $2^k$.

With the method of FIG. 3, the masking (30) will in practice be achieved by suitably programming the DSP 16. As a consequence, the only complexity increase of a system according to the invention will be due to the addition of m bits to the analog-to-digital converter 14. As previously mentioned, since the accuracy of the converter need not be increased, the addition of the m-bits only results in a small complexity increase.

Figure 4:
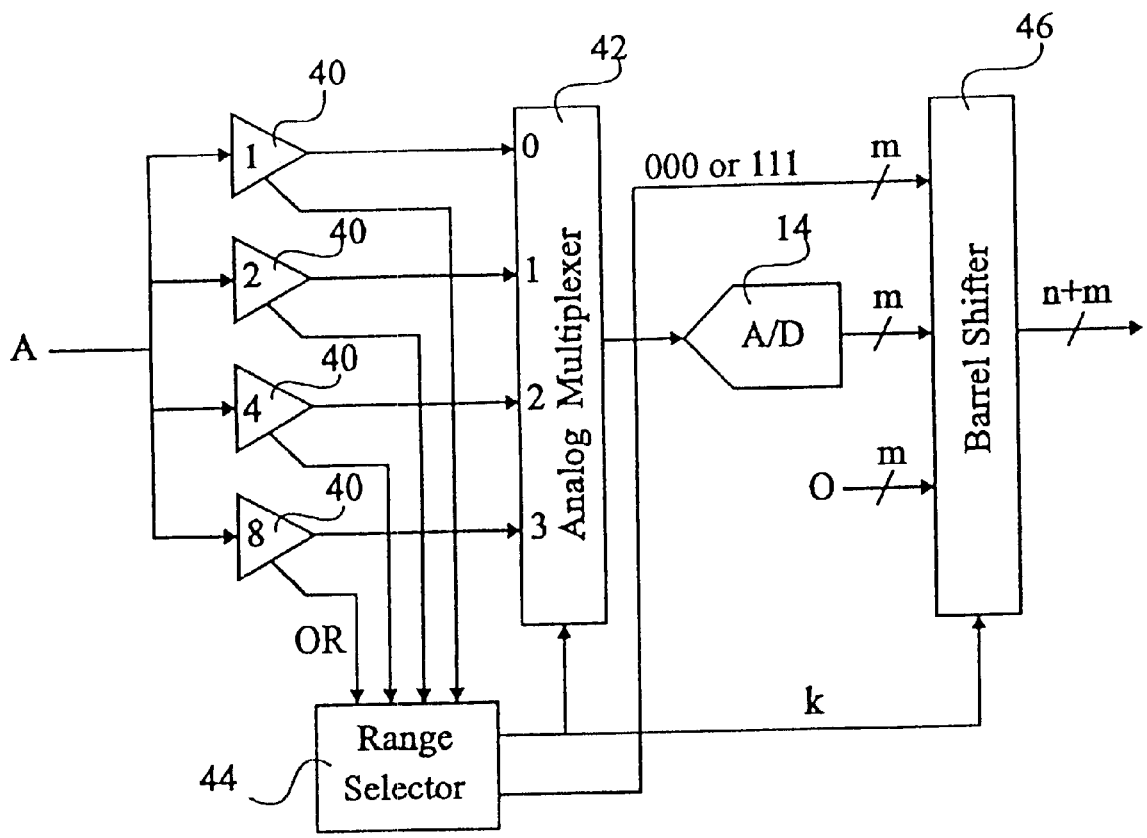
FIG. 4 shows another embodiment of the invention.

FIG. 4 shows another embodiment of the invention. It comprises an n-bit converter 14. The analog input signal A is provided to m+1 amplifiers 40 at the same time. The gains of the successive amplifiers are $2^0$, $2^1$, $2^2$, . . . $2^m$. The outputs of the amplifiers 40 are provided to a multiplexer 42, the output of which is connected to analog-to-digital converter 14.

Each amplifier 40 has an over-range output OR which is enabled when the input signal A exceeds a corresponding range. The range of each amplifier is proportional to the inverse of the gain of the amplifier, and the smallest range, i.e. that of the amplifier of gain $2^m$, is the normal range of the input signal. The over-range outputs OR are provided to a range selector 44 which controls multiplexer 42 to select the $k^{th}$ amplifier (of gain $2^k$), where k is the rank of the last amplifier 40 not enabling its over-range signal OR.

Moreover, the n-bit output of converter 14 is provided to a barrel-shifter 46, further receiving m MSBs from range selector 44, and m zero LSBs. The (n+m)-bit wide output of the barrel-shifter is provided to the DSP (not shown). The barrel-shifter is controlled by the same signal as the multiplexer 42. It selects, for its output, n+m bits counted up from LSB position k (position 0 being the first LSB position).

The m MSBs provided to the barrel-shifter 46 are set by range selector 44 to 000 if the output of converter 14 is positive, and to 111 if the output of converter 14 is negative (in the case of a two's complement encoding). The specific values of the m MSBs will be chosen according to the encoding used for the signed numbers.

With this embodiment, when signal A is within a normal range, the multiplexer selects the amplifier of gain 2 m (8 with m=3). If the signal exceeds this range, but remains within double this range, an amplifier with half the gain is selected, and so on. For example, with m=3, n=3 and positive values, when the normal range amplifier (of gain 8) is selected, the barrel shifter receives value 000abc000 and selects value 000abc, where a, b and c are the bits provided by the analog-to-digital converter 14. Now, if the amplitude of the input signal doubles and the range is exceeded, the next amplifier (of gain 4) is selected. The barrel-shifter still receives value 000abc000, but it selects value 00abc0, which is double the previous value.

Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalents thereto.

What is claimed is:

1. A digital signal processing system, comprising:

a processor exploiting n-bit words provided by an analog-to-digital converter, wherein the analog-to-digital converter is adapted to provide (n+m) bit samples and the system comprises selection means for providing the processor with n least significant bits of a sample when the first non-zero most significant bit of the sample is within the n least significant bits, and with n consecutive bits up to the first non-zero most significant bit when said first non-zero most significant bit is among m most significant bits, the processor being adapted to multiply each n-bit word thus received by a factor corresponding to an offset of the n-bit word with respect to the n least significant bits.

2. The digital signal processing system according to claim 1, wherein the processor has a bus having a width at least equal to n+m, and wherein an output of the analog-to-digital converter is aligned with the least significant bits of said bus and said selection means is adapted to cancel the least significant bits of the bus which are not within said n-bit word.

3. The digital signal processing system according to claim 1, wherein the analog-to-digital converter is constructed to have an n-bit accuracy.

* * * * *

UNITED STATES PATENT AND TRADEMARK OFFICE
CERTIFICATE OF CORRECTION

PATENT NO.     : 6,621,430 B2                                                          Page 1 of 1
DATED          : September 16, 2003
INVENTOR(S)    : Denis J.G. Mestdagh, Bengt Lennart Olsson and John Torvald Lundberg It is certified that error appears in the above-identified patent and that said Letters Patent is hereby corrected as shown below:

<u>Title page,</u>
Item [73], should read as follows:

-- [73]  Assignees: STMicroelectronics S.A., Gentilly, France and
         STMicroelectronics NV, Netherlands --

Signed and Sealed this

Thirteenth Day of April, 2004

JON W. DUDAS
*Acting Director of the United States Patent and Trademark Office*